(12) United States Patent
Kim et al.

(10) Patent No.: US 12,311,415 B2
(45) Date of Patent: May 27, 2025

(54) SUBSTRATE PROCESSING APPARATUS AND SUBSTRATE PROCESSING METHOD (71) Applicant: SEMES CO., LTD., Cheonan-si (KR)

(72) Inventors: Do Hyung Kim, Chungcheongnam-do (KR); Dae Hun Kim, Pyeongtaek-si (KR); Young Jin Kim, Cheonan-si (KR); Tae Ho Kang, Suwon-si (KR); Young Joon Han, Cheonan-si (KR); Eun Hyeok Choi, Cheonan-si (KR); Jun Gwon Lee, Ulsan (KR)

(73) Assignee: SEMES CO., LTD., Cheonan-si (KR)

(*) Notice: Subject to any disclaimer, the term of this patent is extended or adjusted under 35 U.S.C. 154(b) by 0 days.

(21) Appl. No.: 18/126,949

(22) Filed: Mar. 27, 2023

(65) Prior Publication Data
US 2024/0066564 A1    Feb. 29, 2024

(30) Foreign Application Priority Data
Aug. 29, 2022    (KR) ............ 10-2022-0108475

(51) Int. Cl.
| B08B 5/02 | (2006.01) |
| B08B 3/02 | (2006.01) |
| B08B 13/00 | (2006.01) |
| H01L 21/02 | (2006.01) |
| H01L 21/67 | (2006.01) |
| F26B 21/00 | (2006.01) |

(52) U.S. Cl.
CPC ............ *B08B 5/02* (2013.01); *B08B 3/022* (2013.01); *B08B 13/00* (2013.01); *H01L 21/02057* (2013.01); *H01L 21/0209* (2013.01); *H01L 21/67051* (2013.01); *F26B 21/004* (2013.01)

(58) Field of Classification Search
CPC . B08B 5/02; B08B 3/022; B08B 13/00; F26B 21/004; H01L 21/67051; H01L 21/67253; H01L 21/67276; H01L 21/67706; H01L 21/02057; H01L 21/0209; H01L 21/67034; H01L 21/67173; H01L 21/68792
See application file for complete search history.

(56) References Cited

U.S. PATENT DOCUMENTS

2008/0110861 A1*    5/2008    Kajita ............... H01L 21/68728
156/345.21

FOREIGN PATENT DOCUMENTS

| KR | 10-2009-0120346 | 11/2009 |
| KR | 10-2010-0002883 | 1/2010 |
| KR | 10-2011-0058560 | 6/2011 |
| KR | 10-2020-0009397 | 1/2020 |

OTHER PUBLICATIONS

Machine translation of KR 20110058560 A (Year: 2011).*
Office Action from the Korean Intellectual Property Office dated Oct. 24, 2023.

* cited by examiner

Primary Examiner — Erin F Bergner (57) ABSTRACT

Proposed are a substrate processing apparatus and a substrate processing method capable of efficiently preventing contamination of a substrate and a processing space caused by a reverse flow of purge gas.

14 Claims, 7 Drawing Sheets

SUBSTRATE PROCESSING APPARATUS AND SUBSTRATE PROCESSING METHOD

CROSS REFERENCE TO RELATED APPLICATION

The present application claims priority to Korean Patent Application No. 10-2022-0108475, filed Aug. 29, 2022, the entire contents of which is incorporated by reference herein for all purposes.

BACKGROUND OF THE INVENTION

1. Field of the Invention

The present disclosure relates to a substrate processing apparatus and a substrate processing method.

2. Description of the Related Art

The manufacture of semiconductor devices involves various processes such as photography, deposition, asking, etching, ion implantation, and the like. Before and after each process, a cleaning process for removing particles remaining on a substrate is performed.

Conventionally, the cleaning process works by supplying a cleaning liquid to opposite surfaces of the substrate supported by a spin head. A lower surface of the substrate is cleaned by a processing liquid supplied from a lower fluid supply unit provided between the substrate and a support member supporting the substrate.

The lower fluid supply unit is fixed to the substrate support unit supporting the substrate. The lower fluid supply unit may include a plurality of fluid supply nozzles. Each of the fluid supply nozzles is coupled to a body of the lower fluid supply unit and has an ejection end oriented upward toward the lower surface of the substrate. The fluid supply nozzles are positioned adjacent to each other to eject a liquid toward the center of the substrate.

During the cleaning process, the lower fluid supply unit remains fixed while the support member supporting the substrate is rotated to rotate the substrate. In general, in order to rotatably fix an inner pipe of the lower fluid supply unit with respect to the rotating support member, a mechanical member, such as a bearing, is installed in a space between the lower fluid supply unit and the support member. This configuration, however, has a problem in that friction between the mechanical member and the support member and the lower fluid supply unit caused by the rotation of the support member results in generation of particles in the mechanical member itself. The particles generated from the mechanical member itself may be introduced into a space between the substrate and the support member, thereby causing process defects.

In addition, when there occurs a reverse flow of purge gas for discharging contaminants such as chemicals, particles, fumes, and the like to the outside, the contaminants contained in the purge gas may reattach to and contaminate the substrate or the processing space.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a substrate processing apparatus and a substrate processing method capable of preventing a substrate and an inside of a processing space from being contaminated by particles or the like.

Another objective of the present disclosure is to provide a substrate processing apparatus and a substrate processing method capable of preventing particles from bottom of a processing space from flowing reversely upward and reattaching to a substrate and the processing space.

Another objective of the present disclosure is to provide a substrate processing apparatus and a substrate processing method capable of solving the problem of generating particles in a mechanical member itself generally provided to fix a pipe to the substrate processing apparatus.

Another objective of the present disclosure is to provide a substrate processing apparatus and a substrate processing method capable of preventing a reverse flow of purge gas.

The objectives of the present disclosure are not limited to those mentioned above, and other objectives not mentioned will be clearly understood by those skilled in the art from the following description.

In order to achieve the above objectives, according to one aspect of the present disclosure, there is provided a substrate processing apparatus including: a substrate support unit including a support member configured to support a substrate; a processing fluid supply unit configured to supply a processing fluid toward the substrate; and a purge gas supply member configured to supply a purge gas toward the substrate. The purge gas supply member may include: a first supply means configured to discharge the purge gas in a first direction toward a lower surface of the substrate; and a second supply means configured to discharge the purge gas in a second direction opposite to the first direction.

According to another aspect of the present disclosure, there is provided substrate processing equipment including: a load port configured to place thereon a carrier configured to store a substrate; an index frame including an index robot therein configured to transfer the substrate from the carrier placed on the load port; and a process processing module including a substrate processing apparatus configured to perform a liquid processing process on the substrate. The substrate processing apparatus may include: a substrate support unit including a support member configured to support the substrate and a rotation actuating member configured to rotate the substrate; an upper fluid supply unit configured to supply a processing fluid to an upper surface of the substrate; and a lower fluid supply unit configured to supply the processing fluid to a lower surface of the substrate, and the lower fluid supply unit may include: a body having an inner space that is divided into an upper space and a lower space, and inserted into the substrate support unit; and a purge gas supply member provided inside the body and configured to supply a purge gas to a space between the substrate and the support member, that is, the lower surface of the substrate, through a space between the body and the support member. The purge gas supply member may include: a first supply means configured to discharge the purge gas in a first direction toward a lower surface of the substrate; and a second supply means configured to discharge the purge gas in a second direction opposite to the first direction.

According to another aspect of the present disclosure, there is provided a substrate processing method including: a liquid supplying step of supplying a processing liquid to a substrate; a drying step of drying the substrate; and a purge step of supplying a purge gas to the substrate during a part or the whole of the liquid supplying step and the drying step. The purge step may include: a first supplying step of supplying the purge gas in a first direction toward a lower surface of the substrate; and a second supplying step of supplying the purge gas in a second direction opposite to the first direction. Specifically, a final discharge direction of the purge gas supplied in the second supplying step may be opposite to a final discharge direction of the purge gas supplied in the first supplying step.

According to the present disclosure, it is possible to efficiently clean the lower surface of the substrate.

Furthermore, according to the present disclosure, by eliminating the use of a mechanical member, which may act as a particle source, in the substrate processing apparatus, it is possible to prevent contamination of the substrate and the processing space.

Furthermore, according to the present disclosure, by controlling the flow rate of the purge gas discharged to the lower surface of the substrate to be higher than the flow rate of the purge gas discharged in the opposite direction, it is possible to prevent a reverse flow of the purge gas and to prevent particles discharged to the bottom of the processing space from flowing reversely and reattaching to the substrate and the processing space.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in detail with reference to the accompanying drawings such that the present disclosure can be easily embodied by one of ordinary skill in the art to which this disclosure belongs. The present disclosure may, however, be embodied in many different forms and should not be construed as being limited to the embodiments set forth herein. Variations from the shapes of illustrations, as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. It should be appreciated that the regions illustrated in the figures are schematic in nature and their shapes are not intended to illustrate the actual shape of a region of a device and are not intended to limit the scope of the present disclosure. In the description with reference to the accompanying drawings, identical or similar elements are given the same reference numerals regardless of the reference numerals of the drawings, and repeated description thereof will be omitted.

Further, details of well-known functions and configurations may be omitted to avoid unnecessarily obscuring the presented embodiments. Throughout the drawings, the same reference numerals will refer to the same or like parts.

Technical terms, as will be mentioned hereinafter, are terms defined in consideration of their function in the present disclosure, which may be varied according to the intention of a user, practice, or the like Thus, the terms should be defined on the basis of the contents of this specification.

As used herein, the singular forms "a", "an", and "the" are intended to include the plural forms as well, unless the context clearly indicates otherwise. It will be further understood that the terms "comprises" and/or "comprising" when used herein, specify the presence of stated features, integers, steps, operations, elements, and/or components, but do not preclude the presence or addition of one or more other features, integers, steps, operations, elements, components, and/or groups thereof. It will be understood that when an element is referred to as being "connected to" (or coupled to) another element, the element can be directly connected to (or coupled to) the other element or be indirectly connected to (or coupled to) the other element having an intervening element therebetween.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the figures, the size of elements or the thickness of lines may be exaggerated for clarity of illustration.

Figure 1:
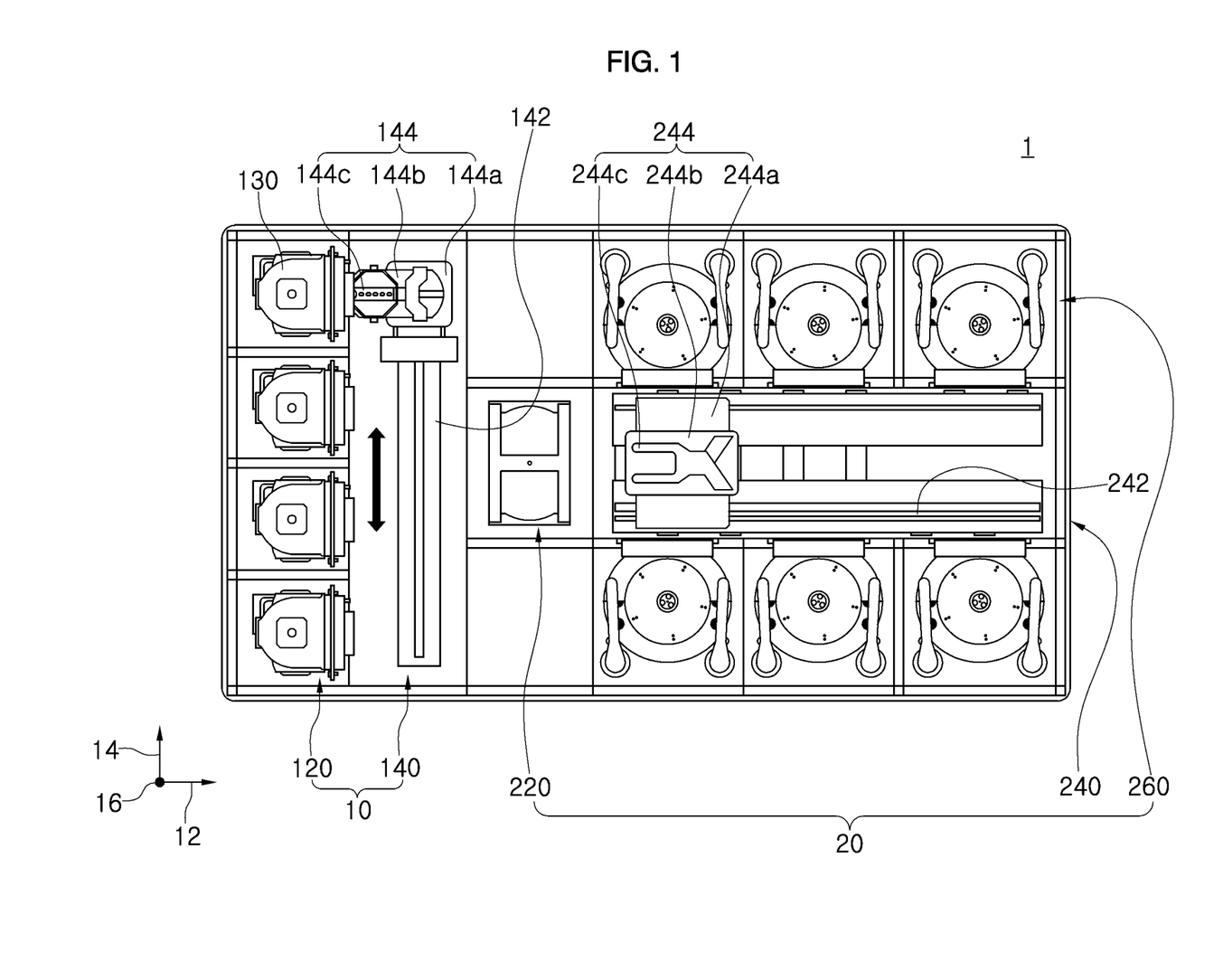
FIG. 1 is a plan view illustrating substrate processing equipment according to an embodiment of the present disclosure.

FIG. 1 is a plan view schematically illustrating an example of substrate processing equipment to which the present disclosure is applicable. Referring to FIG. 1, the substrate processing equipment 1 to which the present disclosure is applicable may include an index module 10 and a process processing module 20. The index module 10 may include a load port 120 and an index frame 140. The load port 120, the index frame 140, and the process processing module 20 may be sequentially arranged in a line. Hereinafter, a direction in which the load port 100, the index frame 140, and the process processing module 20 are arranged is referred to as a first direction 12, a direction orthogonal to the first direction 12 when viewed from above is referred to as a second direction 14, and a direction orthogonal to the plane including the first direction 12 and the second direction 14 is referred to as a third direction 16.

A carrier 130 for storing a substrate W may be placed on the load port 120. A plurality of load ports 120 may be provided. The load ports 120 may be arranged in a line along the second direction 14. The number of the load ports 120 may be increased or decreased according to process efficiency and footprint conditions of the process processing module 20. The carrier 130 may have a plurality of slots (not illustrated) therein for storing a plurality of substrates W horizontally to the ground. As the carrier 130, a front opening unified pod (FOUP) may be used.

The process processing module 20 may include a buffer unit 220, a transfer chamber 240, and a process unit 260. The transfer chamber 240 may be disposed such that a longitudinal direction thereof is parallel to the first direction 12. The process unit 260 may be disposed on each side of the transfer chamber 240. As an example, the respective process units 260 may be provided on opposite sides of the transfer chamber 240 symmetrically with respect to the transfer chamber 240. A plurality of process units 260 may be provided on one side of the transfer chamber 240. Parts of the process units 260 may be disposed along the longitudinal direction of the transfer chamber 240. In addition, parts of the process units 260 may be stacked on top of each other. As an example, the process units 260 may be disposed in an A×B arrangement on one side of the transfer chamber 240. Here, A is the number of the process units 260 provided in a line along the first direction 12, and B is the number of the process units 260 provided in a line along the third direction 16. When four or six process units 260 are provided on one side of the transfer chamber 240, the process units 260 may be disposed in a 2×2 or 3×2 arrangement. The number of the process units 260 may be increased or decreased. Unlike the above description, the process units 260 may be provided on only one side of the transfer chamber 240. In addition, the process units 260 may be provided on one side or each side of the transfer chamber 240 in a single layer structure.

The buffer unit 220 may be disposed between the index frame 140 and the transfer chamber 240. The buffer unit 220 may provide a space where the substrate W stays before being transferred between the transfer chamber 240 and the index frame 140. The buffer unit 220 may have a slot (not illustrated) therein for placing the substrate W. A plurality of slots (not illustrated) may be provided to be spaced apart from each other along the third direction 16. The buffer unit 220 may have open opposite surfaces facing the index frame 140 and the transfer chamber 240, respectively.

The index frame 140 may transfer the substrate W between the carrier 130 placed on the load port 120 and the buffer unit 220. The index frame 140 may be provided with an index rail 142 and an index robot 144. The index rail 142 may be disposed such that a longitudinal direction thereof is parallel to the second direction 14. The index robot 144 may be installed on the index rail 142, and may be moved linearly along the second direction 14 on the index rail 142. The index robot 144 may include a base 144a, a body 144b, and an index arm 144c. The base 144a may be moved along the index rail 142. The body 144b may be coupled to the base 144a. The body 144b may be moved along the third direction 16 on the base 144a. In addition, the body 144b may be rotated on the base 144a. The index arm 144c may be coupled to the body 144b, and may be moved forward and backward with respect to the body 144b. A plurality of index arms 144c may be provided to be individually driven. The index arms 144c may be stacked and spaced apart from each other along the third direction 16. Parts of the index arms 144c may be used to transfer the substrate W from the process processing module 20 to the carrier 130, and the remaining parts of the index arms 144c may be used to transfer the substrate W from the carrier 130 to the process processing module 20. This may be to prevent particles generated from the substrate W before a processing process from being attached to the substrate W after the processing process while the index robot 144 loads and unloads the substrate W.

The transfer chamber 240 may transfer the substrate W between the buffer unit 220 and the process units 260 and between the process units 260. The transfer chamber 240 may be provided with a guide rail 242 and a main robot 244. The guide rail 242 may be disposed such that a longitudinal direction thereof is parallel to the first direction 12. The main robot 244 may be installed on the guide rail 242 and may be moved linearly along the first direction 12 on the guide rail 242. The main robot 244 may include a base 244a, a body 244b, and a main arm 244c. The base 244a may be moved along the guide rail 242. The body 244b may be coupled to the base 244a. The body 244b may be moved along the third direction 16 on the base 244a. In addition, the body 244b may be rotated on the base 244a. The main arm 244c may be coupled to the body 244b, and may be moved forward and backward with respect to the body 244b. A plurality of main arms 244c may be provided to be individually driven. The main arms 244c may be stacked and spaced apart from each other along the third direction 16.

The process units 260 may perform a processing process on the substrate W. Each of the process units 260 may include a substrate processing apparatus 300 for liquid processing of the substrate W by supplying a processing liquid to the substrate W. As an embodiment to which the present disclosure is applied, a substrate processing apparatus that performs a cleaning process by supplying a cleaning liquid to the substrate W will be exemplarily described. The respective substrate processing apparatuses 300 included in the process units 260 may have different structures depending on the type of cleaning process to be performed. On the contrary, the respective substrate processing apparatuses 300 included in the process units 260 may have the same structure. Optionally, the process units 260 may be divided into a plurality of groups. Here, the substrate processing apparatuses 300 provided in the process units 260 belonging to the same group may have the same structure, and the substrate processing apparatuses 300 provided in the process units 260 belonging to different groups may have different structures.

Figure 2:
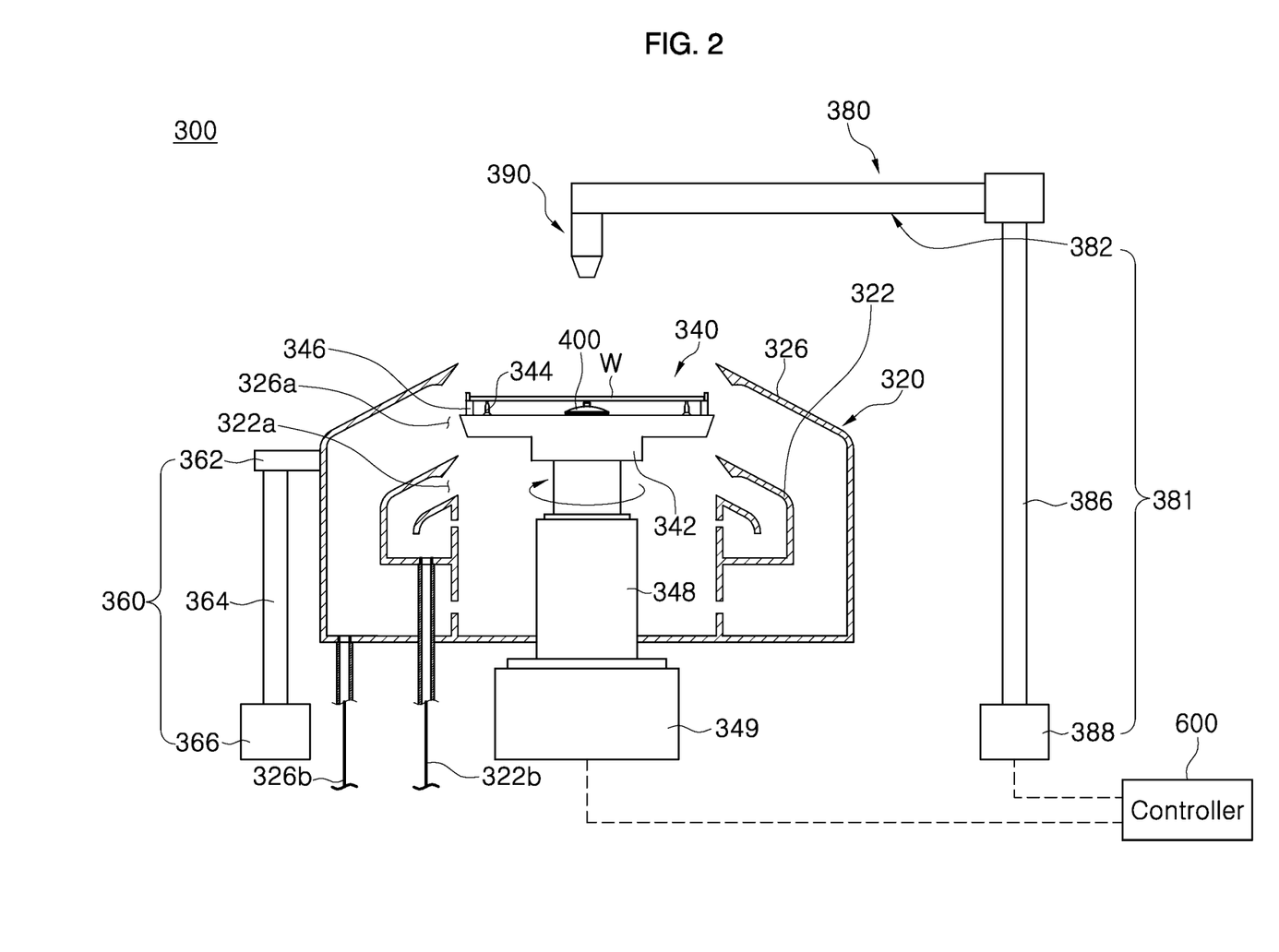
FIG. 2 is a sectional view illustrating a substrate processing apparatus of the substrate processing equipment illustrated in FIG. 1.

FIG. 2 is a sectional view schematically illustrating an example of a substrate processing apparatus 300 provided in the process unit 260 illustrated in FIG. 1. The substrate processing apparatus 300 may perform a liquid processing process on a substrate W. In the present embodiment, the liquid processing process for the substrate W is described as a cleaning process. However, the liquid processing process to which the present disclosure is applied is not limited to the cleaning process, and the present disclosure is applicable to various liquid processing processes, such as photography, asking, etching, and the like.

Referring to FIG. 2, the substrate processing apparatus 300 may include a processing container 320, a substrate support unit 340, a lifting unit 360, a processing fluid supply unit including an upper fluid supply unit 380 and a lower fluid supply unit 400, and a controller 600.

The processing container 320 may provide a processing space therein where the substrate W is processed. The processing container 320 may have a cylindrical shape with an open top. The processing container 320 may prevent a processing liquid supplied to the substrate W from scattering to the surroundings during the process. As an example, the processing container 320 may have an inner recovery tub 322 and an outer recovery tub 326. The inner and outer recovery tubs 322 and 326 may recover different types of processing liquids used in the process. The inner recovery tub 322 may be provided in an annular ring shape surrounding the substrate support unit 340, and the outer recovery tub 326 may be provided in an annular ring shape surrounding the inner recovery tub 322. An inner space of the inner recovery tub 322 may function as a first inlet 322a through which a processing liquid flows into the inner recovery tub 322. A space between the inner recovery tub 322 and the outer recovery tub 326 may function as a second inlet 326a through which a processing liquid flows into the outer recovery tub 326. As an example, the inlets 322a and 326a may be located at different heights. Recovery lines 322b and 326b may be connected to the bottom of the inner and outer recovery tubs 322 and 326, respectively. The processing liquids introduced into the respective recovery tubes 322 and 326 may be supplied to an external processing liquid regeneration system (not illustrated) through the recovery lines 322b and 326b and reused.

The substrate support unit 340 may support the substrate W in the pressing space. The substrate support unit 340 may support and rotate the substrate W during the process. As an example, the substrate support unit 340 may include a spin head. The substrate support unit 340 may include a support member 342, a support pin 344, a chuck pin 346, and a rotation actuating member. The support member 342 may be provided in a substantially circular plate shape with an upper surface and a lower surface. The lower surface may have a smaller diameter than the upper surface. The upper and lower surfaces may be located so that their central axes coincide with each other.

A plurality of support pins 344 may be provided. The support pins 344 may be spaced apart from each other at a predetermined interval on an outer peripheral portion of the upper surface of the support member 342. The support pins 344 may be provided to protrude upward from the support member 342. The support pins 344 may be arranged to form a substantially annular ring shape by combination with each other. The support pins 344 may support an outer peripheral portion of a lower surface of the substrate W so that the substrate W is spaced apart a predetermined distance from the upper surface of the support member 342.

A plurality of chuck pins 346 may be provided. The chuck pins 346 may be arranged farther from the center of the support member 342 than the support pins 344. The chuck pins 346 may be provided to protrude upward from the upper surface of the support member 342. The chuck pins 346 may support lateral side portions of the substrate W so as to prevent the substrate W from being laterally deviated from the original position thereof when the support member 342 is rotated. The chuck pins 346 may be provided to be movable linearly between an outer position and an inner position along a radial direction of the support member 342. Here, the outer position refers to a position farther from the center of the support member 342 than the inner position. When the substrate W is loaded on or unloaded from the substrate support unit 340, the chuck pins 346 may be positioned at the outer position, and when the process is performed on the substrate W, the chuck pins 346 may be positioned at the inner position. In the inner position, the chuck pins 346 and the lateral side portions of the substrate W may be in contact with each other, and in the outer position, the chuck pins 346 and the substrate W may be spaced apart from each other.

The rotation actuating member may rotate the support member 342. The support member 342 may be rotated about its own central axis by the rotation actuating member. The rotation actuating member may include a support shaft 348 and an actuator 349. The support shaft 348 may have a cylindrical shape having a height along the third direction 16. An upper end of the support shaft 348 may be fixedly coupled to the lower surface of the support member 342. As an example, the support shaft 348 may be fixedly coupled to the center of the lower surface of the support member 342. The actuator 349 may provide a driving force for rotating the support shaft 348. The support shaft 348 may be rotated by the actuator 349, and the support member 342 may be rotated in conjunction with the rotation of the support shaft 348.

The lifting unit 360 may linearly move the processing container 320 upward and downward. The upward and downward movement of the processing container 320 may allow the relative height of the processing container 320 with respect to the support member 342 to be changed. The lifting unit 360 may include a bracket 362, a moving shaft 364, and an actuator 366. The bracket 362 may be fixedly installed on an outer wall of the processing container 320. The moving shaft 364 moved upward and downward by the actuator 366 may be fixedly coupled to the bracket 362.

As an example, when the substrate W is loaded on or unloaded from the substrate support unit 340, the processing container 320 may be moved downward so that the substrate support unit 340 protrudes above the processing container 320, and when the process is performed, the height of the processing container 320 may be adjusted so that, according to the type of processing liquid to be supplied to the substrate W, the processing liquid is introduced into a predetermined one of the recovery tubs 322 and 326. Optionally, the lifting unit 360 may move the substrate support unit 340 upward and downward.

The upper fluid supply unit 380 may supply a processing fluid including the processing liquid to an upper surface of the substrate W. The upper surface of the substrate W may be a patterned surface having a predetermined pattern famed thereon. The upper fluid supply unit 380 may include a moving member 381 and a nozzle 390.

The moving member 381 may move the nozzle 390 to a process position and a standby position. Here, the process position may be defined as a position where the nozzle 390 faces the substrate W placed on the substrate support unit 340, and the standby position may be defined as a position where the nozzle 390 is deviated from the process position.

As an example, the process position may include a pre-processing position and a post-processing position. The pre-processing position may be defined as a position where the nozzle 390 supplies the processing liquid to a first supply position, and the post-processing position may be defined as a position where the nozzle 390 supplies the processing liquid to a second supply position. The first supply position may be a position closer to the center of the substrate W than the second supply position, and the second supply position may be a position including an edge of the substrate W. Optionally, the second supply position may be an area adjacent to the edge of the substrate W.

The moving member 381 may include a support shaft 386, an arm 382, and an actuator 388. The support shaft 386 may be located at a side of the processing container 320. The support shaft 386 may have a rod shape with its longitudinal direction being the third direction 16. The support shaft 386 may be rotated by the actuator 388. In addition, the support shaft 386 may be moved upward and downward. The arm 382 may be coupled to an upper end of support shaft 386. The arm 382 may extend perpendicularly from the support shaft 386. The nozzle 390 may be fixedly coupled to an end of the arm 382. As the support shaft 386 is rotated, the nozzle 390 may be swung and moved in conjunction with the arm 382. The nozzle 390 may be swung and moved to the process position and the standby position. Optionally, the arm 382 may be moved forward and backward along its longitudinal direction. When viewed from above, a moving path of the nozzle 390 may coincide with the central axis of the substrate W at the process position. The processing liquid may be, for example, one of a chemical, a rinse liquid, and an organic solvent. Alternatively, the processing liquid may be a mixture of two or more processing liquids. The chemical may be a liquid having acidic or basic properties. Examples of the chemical may include sulfuric acid ($H_2SO_4$), phosphoric acid ($P_2O_5$), hydrofluoric acid (HF), and ammonium hydroxide ($NH_4OH$). The rinse liquid may be pure water ($H_2O$). The organic solvent may be isopropyl alcohol (IPA). Meanwhile, unlike illustrated in FIG. 2, a plurality of upper fluid supply units 380 may be provided for supplying different types of processing liquids.

The lower fluid supply unit 400 may clean and dry the lower surface of the substrate W. The lower fluid supply unit 400 may supply the processing fluid including the processing liquid to the lower surface of the substrate W. The lower surface of the substrate W may be a non-patterned surface opposite to the patterned surface. The lower fluid supply unit 400 and the upper fluid supply unit 380 may simultaneously supply the processing fluid. The lower fluid supply unit 400 may be fixed so as not to be rotated.

Figure 3:
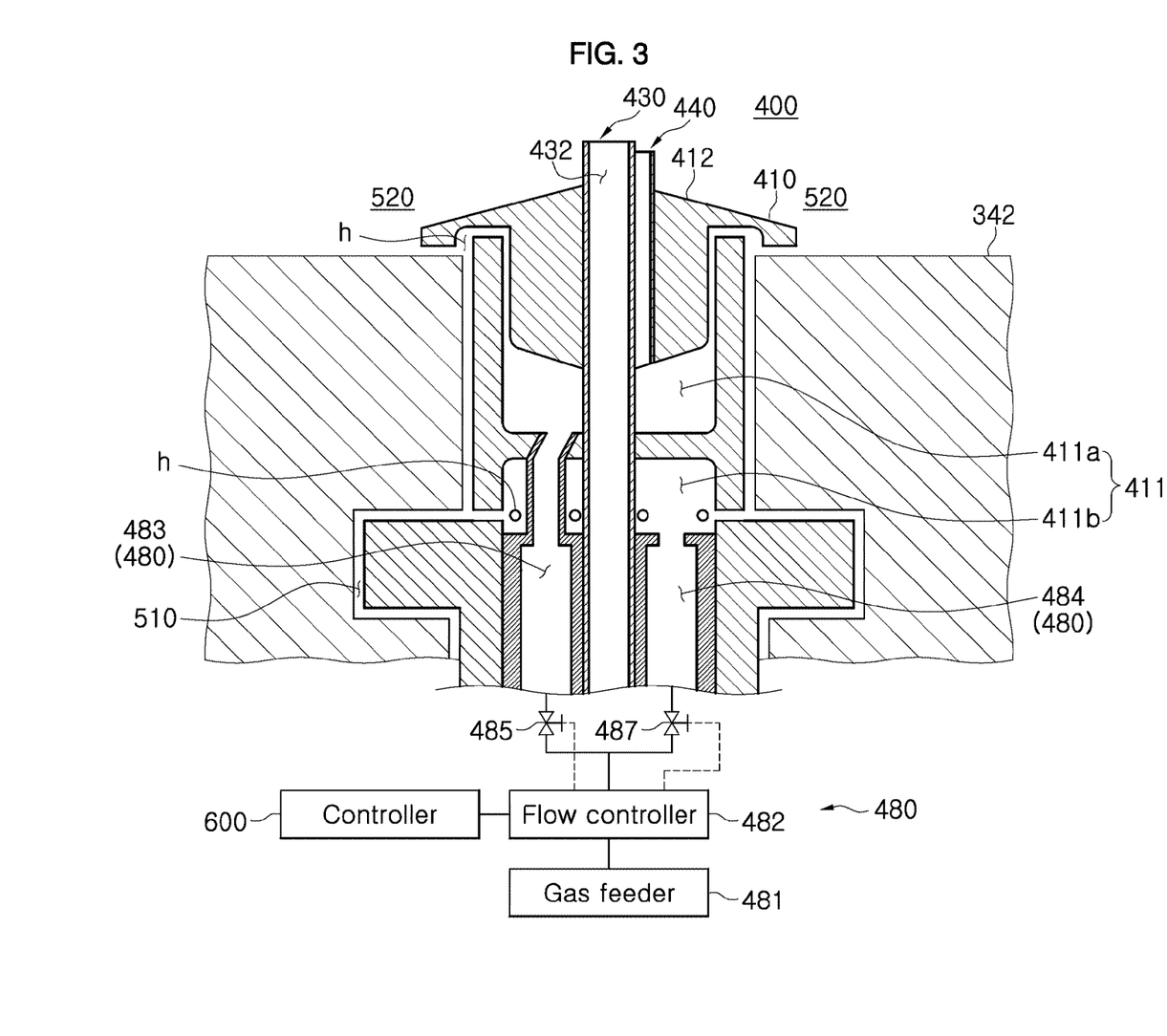
FIG. 3 is an enlarged sectional view illustrating a lower fluid supply unit illustrated in FIG. 2.

FIG. 3 is a sectional view illustrating an embodiment of a lower fluid supply unit 400 according to the present disclosure.

As illustrated in FIG. 3, according to an embodiment of the present disclosure, no mechanical member such as a bearing is provided between the lower fluid supply unit 400 and the support member 342. Mechanical members such as bearings are a general configuration for fixing internal pipes provided in the lower fluid supply unit 400 during rotation of the support member 342. These mechanical members themselves generate particles by friction and thus act as a particle source. Thus, the present disclosure is intended to eliminate the use of the mechanical member that can act as a particle source, thereby preventing process defects caused by particles generated from the mechanical member itself. In addition, the present disclosure is intended to enable purge processing through a lower flow path blocked by the mechanical member, thereby preventing chemicals, particles, fumes, and the like from the bottom of a body 410 from flowing reversely into a space 520 between the substrate W and the support member 342 through a space 510 between the body 410 and the support member 342.

The lower fluid supply unit 400 may include the body 410, a liquid ejection nozzle 430, a drying gas nozzle 440, and a purge gas supply member 480.

The body 410 may be provided in a shape inserted into the support member 342 of the substrate support unit 340. An upper end portion of the body 410 may be positioned between the support member 342 and the substrate W supported thereby. When viewed from above, the center of the body 410 may be positioned to coincide with the center of the support member 342. The body 410 may be positioned independently of the support member 342. The body 410 may be positioned so as not to be affected by rotation of the support member 342. The body 410 may be centrally inserted into the support member 342 so as to be spaced apart from the support member 342 by a predetermined distance. The upper end portion of the body 410 may be provided in a circular plate shape with an upper surface 412 and a lower surface. The upper surface 412 of the body 410 may be formed to be gradually inclined downward from the center thereof. The upper surface 412 of the body 410 may be positioned to protrude upward from the support member 342.

The body 410 may have an inner space 411 divided into an upper space 411a and a lower space 411b. The upper space 411a and the lower space 411b may not communicate with each other. As an example, the body 410 may be provided inside the support shaft 348. The body 410 may be spaced apart from an inner surface of the support shaft 348 by a predetermined distance. At least one or more discharge holes h communicating with the outside may be formed on a side surface of the body 410, specifically, on a side surface of the body 410 at a position corresponding to each of the upper space 411a and the lower space 411b. The discharge holes h may discharge a purge gas supplied from the purge gas supply member 480 to the inner space of the body 410 to the outside. The discharge holes h may be formed on the side surface of the body 410 at a position corresponding to each of the upper space 411a and the lower space 411b so as to be spaced apart from each other at a regular interval along the circumference of the side of the body 410. Meanwhile, the size of the discharge holes h famed on the side surface of the body 410 at a position corresponding to the upper space 411a may be larger than that of the discharge holes h formed on the side surface of the body 410 at a position corresponding to the lower space 411b.

The liquid ejection nozzle 430 may supply a processing liquid to the lower surface of the substrate W. The processing liquid ejected from the liquid ejection nozzle 430 may clean the lower surface of the substrate W. The liquid ejection nozzle 430 may have a liquid ejection end oriented upward. As an example, the liquid ejection end may be oriented vertically upward. The liquid ejection nozzle 430 may be fixedly coupled to the body 410. The liquid ejection nozzle 430 may be located at the center of the body 410. The processing liquid may be transferred to the liquid ejection nozzle 430 through a liquid ejection line 432 and supplied to the lower surface of the substrate W.

Meanwhile, a plurality of liquid ejection nozzles 430 may be provided for ejecting different types of liquids. When the plurality of liquid ejection nozzles 430 are provided, the liquid ejection nozzles 430 may be spaced apart from the center of the body 410. The liquid ejection nozzles 430 may be radially arranged around the center of the body 410. The liquid ejection nozzles 430 may be arranged to form a substantially annular ring shape by combination with each other. The processing liquid ejected from the liquid ejection nozzles 430 may include a chemical and a rinse liquid. The chemical may be a liquid having acidic or basic properties. Examples of the chemical may include sulfuric acid ($H_2SO_4$), phosphoric acid ($P_2O_5$), hydrofluoric acid (HF), and ammonium hydroxide ($NH_4OH$). The rinse liquid may be pure water ($H_2O$). Optionally, the liquid ejection end may be formed to be gradually inclined upward away from the center of the substrate W.

The drying gas nozzle 440 may supply a drying gas to the lower surface of the substrate W. The drying gas nozzle 440 may be fixedly coupled to the upper surface 412 of the body 410. As an example, the drying gas nozzle 440 may be located on one side of the liquid ejection nozzle 430. The drying gas nozzle 440 may receive the drying gas from a drying gas source.

The drying gas nozzle 440 may have an upper ejection end formed at an upper end thereof. The upper ejection end may be oriented vertically upward. The drying gas ejected from the drying gas nozzle 440 may dry the lower surface of the substrate W. The drying gas may be, for example, an inert gas or air. The inert gas may be nitrogen gas ($N_2$).

The purge gas supply member 480 may supply the purge gas. The purge gas may prevent chemicals, particles, fumes, and the like, which may be introduced from the bottom of the substrate processing apparatus 300, from flowing reversely into the space 520 between the substrate W and the support member 342 through the space 510 between the body 410 and the support member 342. The purge gas supply member 480 may include a gas feeder 481, a flow controller 482, a first supply means 483, and a second supply means 484.

The gas feeder 481 may store the purge gas. The purge gas may be, for example, an inert gas or air. The inert gas may be nitrogen gas ($N_2$). The gas feeder 481 may supply the purge gas to the first supply means 483 and the second supply means 484.

The flow controller 482 may be connected to the gas feeder 481. The flow controller 482 may adjust a supply flow rate per unit time of the purge gas. As an example, the flow controller 482 may adjust the supply flow rate per unit time of the purge gas supplied to the first supply means 483 and the second supply means 484 in response to a signal generated by a controller 600. The flow controller 482 may include a flow control valve 485 and a second control valve 487.

The first and second flow control valves 485 and 487 may be provided with the first supply means 483 and the second supply means 484, respectively. As an example, the first and second flow control valves 485 and 487 may be respectively installed on respective pipes provided in the first supply means 483 and the second supply means 484. The first flow control valve 485 may be provided in the first supply means 483, and the second flow control valve 487 may be provided in the second supply means 484. The supply flow rate per unit time of the purge gas supplied to the first supply means 483 and the second supply means 484 may be adjusted according to the opening ratios of the first and second flow control valves 485 and 487.

The first supply means 483 may discharge the purge gas in a first direction oriented toward the space 520 between the substrate W and the support member 342, that is, toward the lower surface of the substrate W. The first supply means 483 may communicate with the upper space 411a to form a first flow path f1 extending toward the top of the body 410. Specifically, the purge gas supplied by the first supply means 483 may be supplied to the space 510 between the body 410 and the support member 342 through the discharge holes h communicating with the upper space 411a and then discharged to the lower surface of the substrate W.

The second supply means 484 may discharge the purge gas in a second direction opposite to the first direction. The second supply means 484 may communicate with the lower space 411b to form a second flow path f2 extending toward the bottom of the body 410. Specifically, the purge gas supplied by the second supply means 4834 may be supplied to the space 510 between the body 410 and the support member 342 through the discharge holes h communicating with the lower space 411b and then discharged vertically downward.

Discharge of the purge gas in the first direction and discharge of the purge gas in the second direction may be performed simultaneously, and supply of the purge gas by the first supply means 483 and the second supply means 484 may be performed during a part or the whole of a liquid supplying step of supplying the processing liquid to the upper surface of the substrate W and a drying step of drying the substrate W. As an example, supply of the purge gas may be continuously performed during the liquid supplying step and the drying step. Alternatively, supply of the purge gas may be performed periodically during the liquid supplying step and the drying step. Alternatively, supply of the purge gas may be performed after each of the liquid supplying step and the drying step is finished.

The first supply means 483 and the second supply means 484 may have, for example, a cylindrical tubular shape. However, the present disclosure is not limited thereto, and the first supply means 483 and the second supply means 484 may have any of various shapes.

The controller 600 may control the purge gas supply member 480. The controller 600 may be connected to the flow controller 482 of the purge gas supply member 480 to adjust the respective supply flow rates per unit time of the purge gas supplied to the first supply means 483 and the second supply means 484. As an example, the controller 600 may generate a control signal on the basis of a substrate processing step and transmit the control signal to the flow controller 482. In addition, the controller 600 may control the first supply means 483 and the second supply means 484 to perform discharge of the purge gas simultaneously. The flow controller 482 may adjust a discharge flow rate per unit time of the purge gas discharged from each of the first and second supply means 483 and 484 by controlling the opening ratios of the flow control valves 485 and 487 provided in the first and second supply means 483 and 484, respectively, on the basis of the control signal transmitted from the controller 600. Meanwhile, the control signal generated by the controller 600 is not limited thereto, and the controller 600 may generate any of various types of signals.

In addition, the controller 600 may control the rotation actuating member. The controller 600 may be connected to the actuator 349 of the rotation actuating member to adjust the rotational speed of the support member 342. As an example, the controller 600 may generate a control signal on the basis of the substrate processing step and transmit the control signal to the actuator 349. The actuator 349 may adjust the rotational speed of the support member 342 on the basis of the control signal transmitted from the controller 600. Meanwhile, the control signal generated by the controller 600 is not limited thereto, and the controller 600 may generate any of various types of signals.

Figure 4:
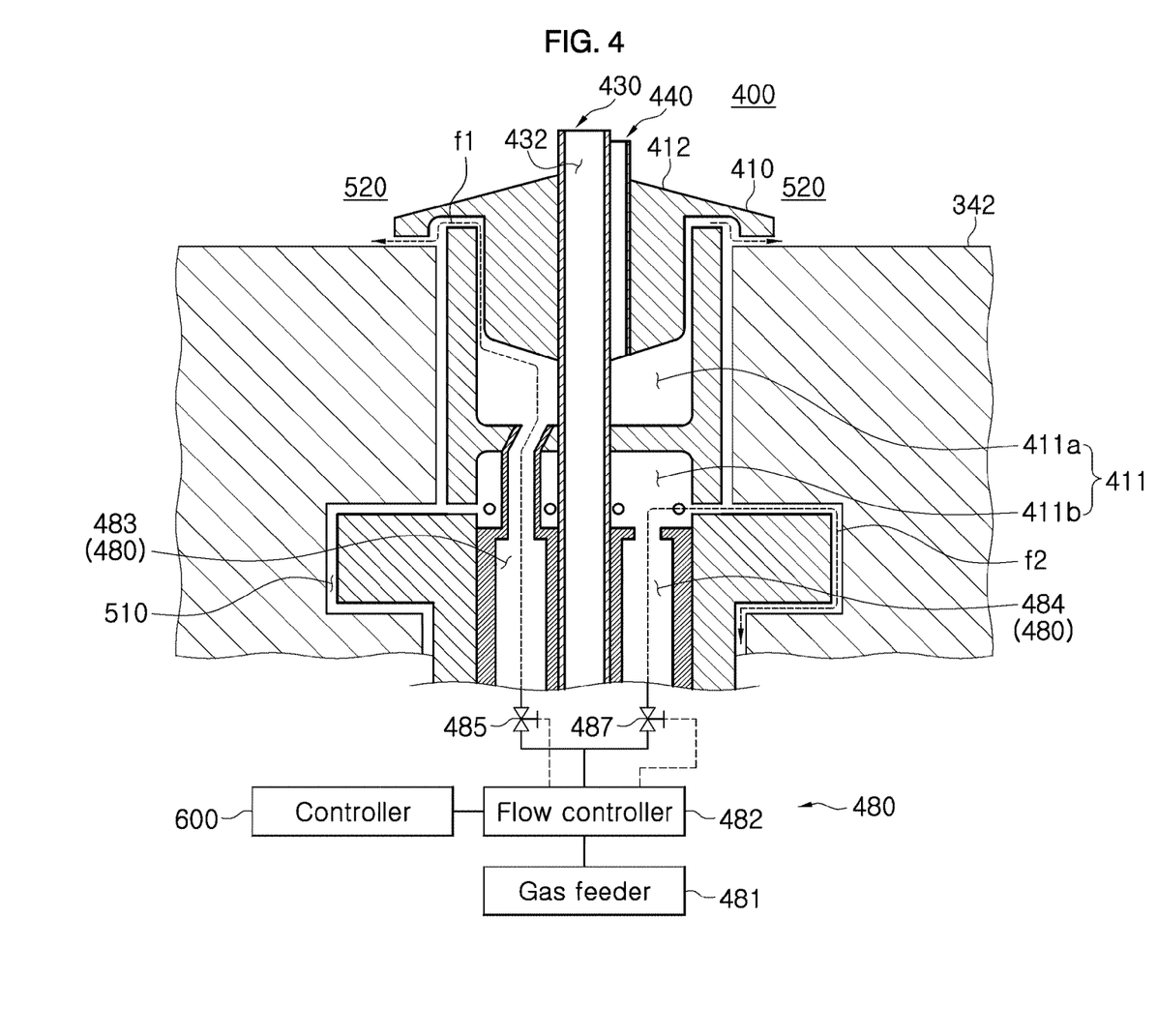
FIG. 4 is a view illustrating a flow of purge gas in the lower fluid supply unit illustrated in FIG. 3.
Figure 5:
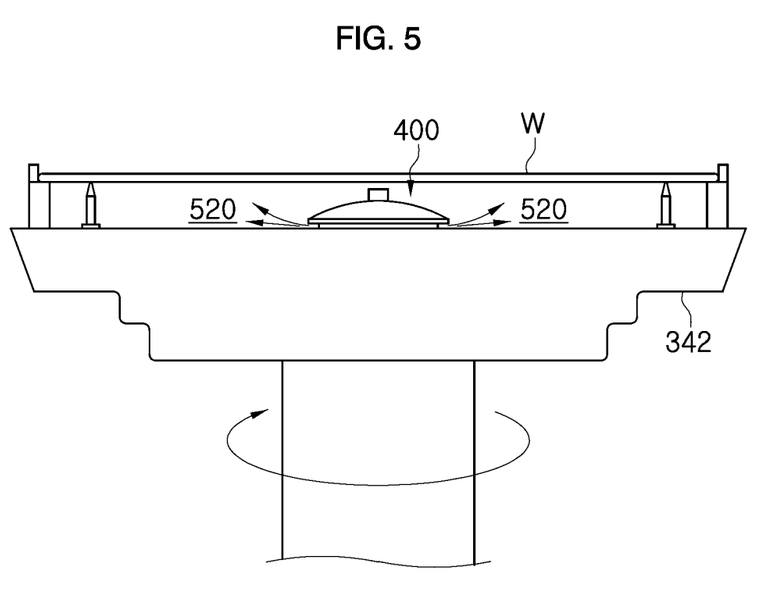
FIG. 5 is a view illustrating a flow of purge gas in the substrate processing apparatus illustrated in FIG. 2.

FIG. 4 is a view illustrating a flow of purge gas in the lower fluid supply unit 400 illustrated in FIG. 3. FIG. 5 is a view illustrating a flow of purge gas in the substrate processing apparatus 300 illustrated in FIG. 2.

Referring to FIGS. 4 and 5, the purge gas supplied by the first supply means 483 may be discharged along the first flow path f1 which sequentially passes through the discharge holes h communicating with the upper space 411a, the spaced 510 between the body 410 and the support member 342, and the lower surface of the substrate W. The purge gas discharged along the first flow path f1 may be exhausted to the outside through the space 520 between the substrate W and the support member 342.

The purge gas supplied by the second supply means 484 may be discharged along the second flow path f2, which sequentially passes through the discharge holes h communicating with the lower space 411b, the spaced 510 between the body 410 and the support member 342, and the bottom of the body 410, into the space 510 between the body 410 and the support member 342. The purge gas discharged into the space 510 may flow vertically downward and then be exhausted to the outside.

The controller 600 may adjust the discharge flow rate per unit time of the purge gas discharged from the first supply means 483 to a first flow rate, and adjust the discharge flow rate per unit time of the purge gas discharged from the second supply means 484 to a second flow rate. Here, it is preferable that the first flow rate and the second flow rate are controlled to be different and the first flow rate is controlled to be higher than the second flow rate. By controlling the first flow rate discharged vertically upward to be higher than the second flow rate discharged vertically downward, the purge gas discharged in the second direction may be prevented from flowing reversely in the opposite direction to the discharge direction through the space 510 located in an area defined between the discharge holes h formed at a position corresponding to the upper space 411*a* and the discharge holes h formed at a position corresponding to the lower space 411*b*. In addition, the purge gas discharged in the first direction may be prevented from flowing reversely in the opposite direction to the discharge direction through the space 510 located in an area defined between the discharge holes h formed at a position corresponding to the upper space 411*a* and the discharge holes h formed at a position corresponding to the lower space 411*b*.

Meanwhile, adjusting the discharge flow rate discharged from the first supply means 483 and the discharge flow rate discharged from the second supply means 484 may be achieved by any of various methods other than the above method using flow control valves. An example may include a method of adjusting the pressure of the purge gas supplied to the first supply means 483 higher than the pressure of the purge gas supplied to the second supply means 484, or a method of forming the size of the discharge holes h formed at a position corresponding to the upper space 411*a* to be significantly larger than the size of the discharge holes h famed at a position corresponding to the lower space 411*b*.

Figure 6:
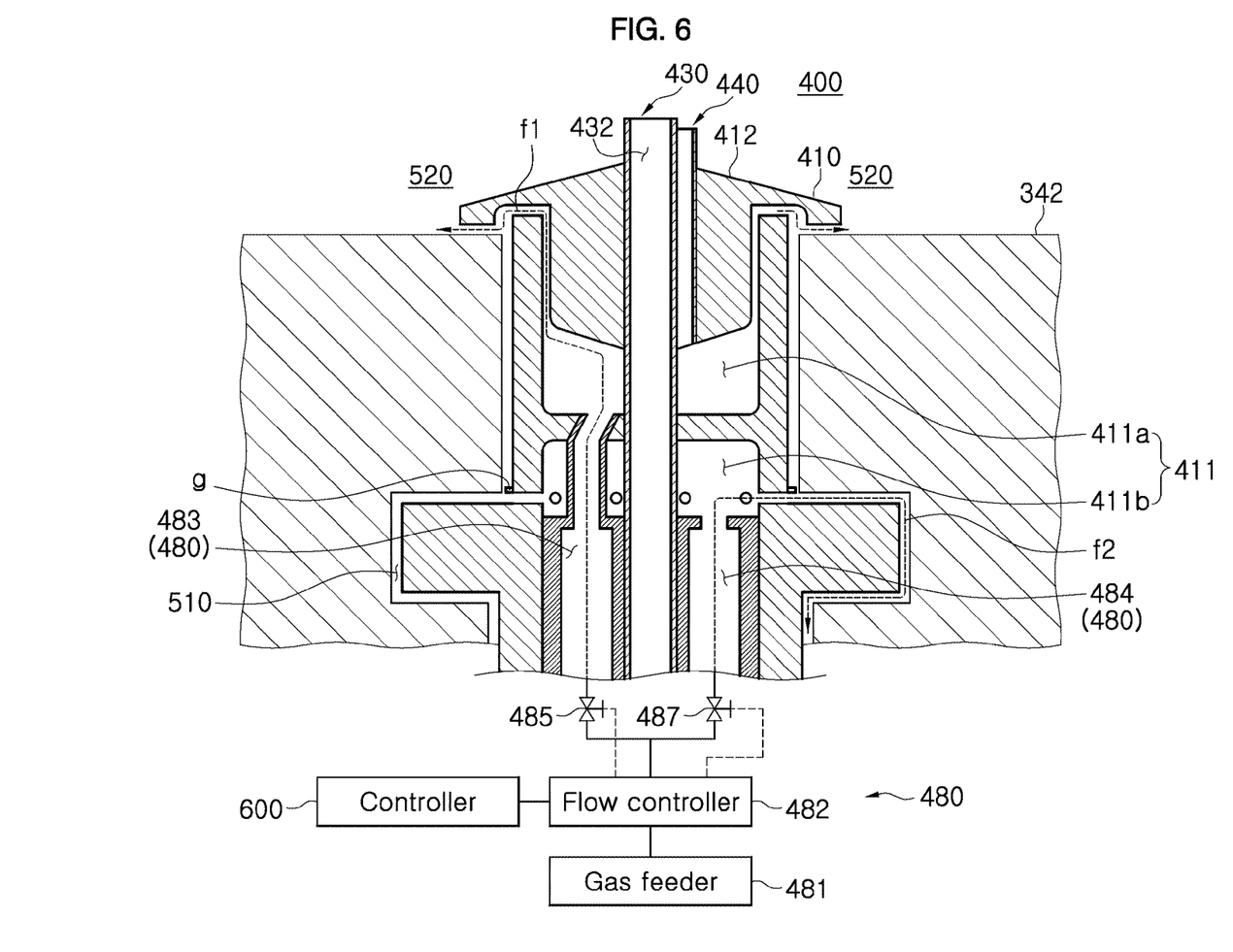
FIG. 6 is an enlarged sectional view illustrating another embodiment of FIG. 3.

Meanwhile, as illustrated in FIG. 6, the body 410 may include a guide member g to prevent the purge gas discharged in the second direction along the second flow path f2 from flowing reversely. As an example, the guide member g may be provided above each of the discharge holes h formed at a position corresponding to the lower space 411*b*, and may have a shape protruding from an outer surface of the body 410 toward an inner surface of the support member 342 to guide the flow of purge gas. The guide member g may be provided, for example, in a roof shape having a semicircular cross-section so as to block a reverse flow of the purge gas discharged along the second flow path f2. Meanwhile, the guide member g may also block a reverse flow of the purge gas discharged along the first flow path f1.

Figure 7:
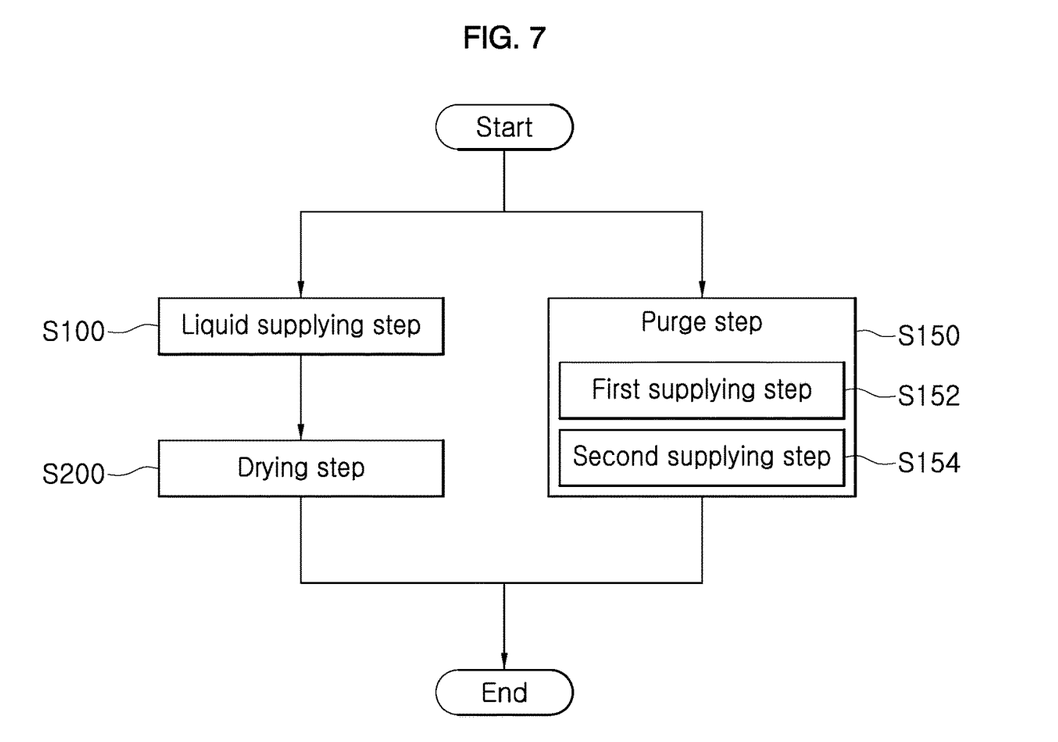
FIG. 7 is a flowchart schematically illustrating a substrate processing method according to an embodiment of the present disclosure.

FIG. 7 is a flowchart schematically illustrating a substrate processing method according to an embodiment of the present disclosure.

Referring to FIG. 7, the substrate processing method according to the embodiment of the present disclosure may include a liquid supplying step S100 of supplying a processing liquid to a substrate W, a drying step S200 of drying the substrate W, and a purge step S150.

In the liquid supplying step S100, the substrate W may be processed by supplying the processing liquid to the substrate W. The liquid supplying step S100 may include supplying the processing liquid to an upper surface of the substrate and supplying the processing liquid to a lower surface of the substrate. Optionally, supplying the processing liquid to the upper surface of the substrate W and supplying the processing liquid to the lower surface of the substrate W may be performed simultaneously or separately. The processing liquid supplied to the substrate W may be, for example, one of a chemical, a rinse liquid, and an organic solvent.

The chemical may be a liquid having acidic or basic properties. Examples of the chemical may include sulfuric acid ($H_2SO_4$), phosphoric acid ($P_2O_5$), hydrofluoric acid (HF), and ammonium hydroxide ($NH_4OH$). The rinse liquid may be pure water ($H_2O$). The organic solvent may be isopropyl alcohol (IPA).

In the drying step S200, the processing liquid remaining on the substrate W may be dried. In the drying step S200, the substrate W may be rotated at high speed. The processing liquid remaining on the upper or lower surface of the substrate W may be separated from the substrate W by a centrifugal force resulting from the high-speed rotation of the substrate W. Also, in the drying step S200, a drying gas may be supplied to the lower surface of the substrate W. The drying gas may be, for example, an inert gas or air. The inert gas may be nitrogen gas ($N_2$). By supplying the drying gas to the lower surface of the substrate W, the processing liquid remaining on the lower surface of the substrate W may be efficiently dried. Meanwhile, the drying step S200 may be divided into a plurality of steps according to the rotational speed of the substrate W.

In the purge step S150, a purge gas may be supplied to the substrate W. The purge step S150 may be performed during a part or the whole of the liquid supplying step S100 and the drying step S200. The purge step S150 may include a first supplying step S152 and a second supplying step S154. As an example, the purge step S150 may be continuously performed during the liquid supplying step and the drying step. Alternatively, the purge step S150 may be performed periodically during the liquid supplying step and the drying step. Alternatively, the purge step S150 may be performed after each of the liquid supplying step and the drying step is finished.

The first supplying step S152 is a step of discharging the purge gas in a first direction toward the lower surface of the substrate W by supplying the purge gas to a first supply means 483. In the first supplying step S152, a discharge flow rate per unit time of the discharged purge gas may be controlled to a first flow rate.

The second supplying step S154 is a step of discharging the purge gas in a second direction opposite to the first direction by supplying the purge gas to a second supply means 484. In the second supplying step S154, a discharge flow rate per unit time of the discharged purge gas may be controlled to a second flow rate.

While simultaneously performing the first supplying step S152 and the second supplying step S154 may be performed simultaneously, by controlling the first flow rate supplied in the first direction to be higher than the second flow rate supplied in the second direction, a reverse flow of the purge gas supplied in the second direction may be prevented.

Meanwhile, the substrate processing method according to the embodiment of the present disclosure may further include a step of controlling the rotational speed of the substrate W. The rotational speed of the substrate W may be controlled by adjusting the rotational speed of a support member 342. The controller 600 may adjust the rotational speed of the support member 342 on the basis of a substrate processing step. The rotational speed of the substrate W may be variously controlled according to substrate processing process conditions.

As described above, the present disclosure is characterized by eliminating the use of a mechanical member that can act as a particle source, simultaneously discharging the purge gas not only in the first direction toward the lower surface of the substrate W but also in the second direction opposite to the first direction, and controlling the flow rate of the purge gas discharged in the first direction to be higher than the flow rate of the purge gas discharged in the second direction. With this configuration, it is possible to prevent generation of particles in the mechanical member itself, and to effectively block chemicals, particles, fumes, and the like, which may be introduced from the bottom of the substrate processing apparatus 300, from flowing into the space 520 between the substrate W and the support member 342 and contaminating the substrate W.

In addition, by controlling the flow rate of the purge gas discharged in the first direction to be higher than the flow rate of the purge gas discharged in the second direction, it is possible to prevent the purge gas discharged in the first direction, which is the main flow direction, from flowing reversely in the second direction.

Although exemplary embodiments of the present disclosure have been described for illustrative purposes, those skilled in the art will appreciate that various modifications, additions, and substitutions are possible, without departing from the scope and spirit of the present disclosure. Therefore, exemplary embodiments of the present disclosure have not been described for limiting purposes, and the scope of the disclosure is not to be limited by the above embodiments. The scope of the present disclosure should be determined on the basis of the descriptions in the appended claims, and all equivalents thereof should belong to the scope of the present disclosure.

What is claimed is:

1. A substrate processing apparatus comprising:
a substrate support unit comprising a support member configured to support a substrate;
a processing fluid supply unit configured to supply a processing fluid toward the substrate; and
a purge gas supply member configured to supply a purge gas toward the substrate,
wherein the purge gas supply member comprises:
a first supply pipe discharging the purge gas in a first direction toward a lower surface of the substrate; and
a second supply pipe discharging the purge gas in a second direction opposite to the first direction,
wherein the purge gas supply member is provided inside a body, the body having an inner space divided into an upper space and a lower space and being inserted into the substrate support unit,
wherein the upper space of the body is in communication with the first supply pipe,
wherein the lower space of the body is in communication with the second supply pipe, and
wherein the upper space and the lower space are not in communication with each other within the body.

2. The substrate processing apparatus of claim 1,
wherein the purge gas supply member supplies the purge gas to the lower surface of the substrate by discharging the purge gas into a space between the substrate support unit and the body, and
wherein at least one discharge hole configured to discharge the purge gas into the space between the substrate support unit and the body is formed along a circumference of a side surface of the body.

3. The substrate processing apparatus of claim 1, further comprising:
a controller configured to control the purge gas supply member,
wherein the controller controls discharge of the purge gas in the first direction and discharge of the purge gas in the second direction to be simultaneously performed.

4. The substrate processing apparatus of claim 3, further comprising:
a first control valve provided at the first supply pipe; and
a second control valve provided at the second supply pipe,
wherein the controller controls an opening ratio of each the first and second control valves such that a discharge flow rate per unit time of the purge gas discharged from each of the first and second supply pipes is adjusted.

5. The substrate processing apparatus of claim 4,
wherein the controller adjusts the discharge flow rate per unit time of the purge gas discharged from the first supply pipe to a first flow rate,
the controller adjusts the discharge flow rate per unit time of the purge gas discharged from the second supply pipe to a second flow rate, and
the first flow rate is higher than the second flow rate.

6. The substrate processing apparatus of claim 2,
wherein the body comprises a guide member protruding from an outer surface of the body toward an inner surface of the support member, and
wherein the guide member is provided above a discharge hole, located at a position corresponding to the lower space, among the at least one discharge hole formed on the side surface of the body.

7. The substrate processing apparatus of claim 1,
wherein the processing fluid supply unit further comprises a drying gas nozzle configured to supply a drying gas toward the substrate to dry the substrate.

8. Substrate processing equipment comprising:
a load port configured to place thereon a carrier configured to store a substrate;
an index frame comprising an index robot therein configured to transfer the substrate from the carrier placed on the load port; and
a process processing module comprising a substrate processing apparatus configured to perform a liquid processing process on the substrate,
wherein the substrate processing apparatus comprises:
a substrate support unit comprising a support member configured to support the substrate and a rotation actuating member configured to rotate the substrate;
an upper fluid supply unit configured to supply a processing fluid to an upper surface of the substrate; and
a lower fluid supply unit configured to supply the processing fluid to a lower surface of the substrate,
wherein the lower fluid supply unit comprises:
a body having an inner space that is divided into an upper space and a lower space, and inserted into the substrate support unit; and
a purge gas supply member provided inside the body and configured to supply a purge gas to the lower surface of the substrate through a space between the body and the support member,
wherein the purge gas supply member comprises:
a first supply pipe configured to discharge the purge gas in a first direction toward a lower surface of the substrate; and
a second supply pipe configured to discharge the purge gas in a second direction opposite to the first direction,
wherein the upper space of the body is in communication with the first supply pipe, wherein the lower space of the body is in communication with the second supply pipe, and wherein the upper space and the lower space are not in communication with each other within the body.

9. The substrate processing equipment of claim 8, wherein the purge gas is supplied to the lower surface of the substrate by discharging the purge gas into a space between the substrate support unit and the body, and at least one discharge hole configured to discharge the purge gas into the space between the substrate support unit and the body is formed along a circumference of a side surface of the body.

10. The substrate processing equipment of claim 9, further comprising:

a controller configured to control the purge gas supply member, wherein the controller controls discharge of the purge gas in the first direction and discharge of the purge gas in the second direction to be simultaneously performed.

11. The substrate processing equipment of claim 10, wherein each of the first supply pipe and the second supply pipe comprises a flow control valve, and wherein the controller adjusts a discharge flow rate per unit time of the purge gas discharged from each of the first and second supply pipe by controlling an opening ratio of the flow control valve provided in each of the first and second supply pipe.

12. The substrate processing equipment of claim 11, wherein the controller adjusts the discharge flow rate per unit time of the purge gas discharged from the first supply pipe to a first flow rate, wherein the controller adjusts the discharge flow rate per unit time of the purge gas discharged from the second supply pipe to a second flow rate, and wherein the first flow rate is higher than the second flow rate.

13. The substrate processing equipment of claim 12, wherein the body comprises a guide member protruding from an outer surface of the body toward an inner surface of the support member, and the guide member is provided above a discharge hole, located at a position corresponding to the lower space, among the at least one discharge hole formed on a side surface of the body.

14. The substrate processing equipment of claim 8, wherein the lower fluid supply unit further comprises a drying gas nozzle configured to supply a drying gas toward the lower surface of the substrate to dry the lower surface of the substrate.

* * * * *